(12) United States Patent
Katoch et al.

(10) Patent No.: US 8,929,160 B2
(45) Date of Patent: Jan. 6, 2015

(54) TRACKING CIRCUIT

(71) Applicants: Atul Katoch, Kanata (CA); Mayank Tayal, Ottawa (CA)

(72) Inventors: Atul Katoch, Kanata (CA); Mayank Tayal, Ottawa (CA)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 129 days.

(21) Appl. No.: 13/781,159

(22) Filed: Feb. 28, 2013

(65) Prior Publication Data

US 2014/0241077 A1     Aug. 28, 2014

(51) Int. Cl.
*G11C 7/00*     (2006.01)
*G11C 7/12*     (2006.01)
*G11C 7/22*     (2006.01)

(52) U.S. Cl.
CPC . *G11C 7/12* (2013.01); *G11C 7/227* (2013.01)
USPC .............. 365/189.11; 365/154; 365/194

(58) Field of Classification Search
CPC .............. G11C 7/08; G11C 7/12; G11C 7/14; G11C 7/22; G11C 7/222; G11C 7/227
USPC ...................... 365/189.11, 154, 194
See application file for complete search history.

(56) References Cited

U.S. PATENT DOCUMENTS

| | | | | |
|---|---|---|---|---|
| 7,787,317 | B2 * | 8/2010 | Wang | 365/200 |
| 8,125,842 | B2 * | 2/2012 | Dudeck et al. | 365/194 |
| 8,279,693 | B2 * | 10/2012 | Wang | 365/205 |
| 8,315,085 | B1 * | 11/2012 | Chang et al. | 365/154 |
| 8,477,527 | B2 * | 7/2013 | Wang et al. | 365/154 |

\* cited by examiner

*Primary Examiner* — Tan T. Nguyen
(74) *Attorney, Agent, or Firm* — Lowe Hauptman & Ham, LLP (57) ABSTRACT

A current flowing through a voltage line and/or a data line in a column of a tracking circuit is determined. A threshold tracking time delay of the tracking circuit is determined. Based on the determined current handled by the voltage line and/or the data line and the determined threshold tracking time delay, a plurality of columns in the tracking circuit, a number of first cells in each column of the plurality of columns, and a number of second cells in the each column of the plurality of columns are determined.

20 Claims, 9 Drawing Sheets

TRACKING CIRCUIT

FIELD

The present disclosure is related to a tracking circuit.

BACKGROUND

A tracking circuit is used in a memory circuit, such as a static random access memory (SRAM), to track timing of various signals of the memory circuit. In an existing approach, a tracking circuit includes a tracking bit line and a number of pull-down cells. When the tracking circuit is in operation, the pull-down cells pull down a voltage level on the tracking bit line. When the number of pull-down cells in the tracking circuit is large, the tracking bit line is affected by an electron migration phenomenon.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. A number of load cells and bit cells in a column in a tracking circuit are determined based on a predetermined threshold current. A current flowing through a tracking bit line and a tracking supply reference voltage line LVSS is reduced compared with that of in another approach. For example, in some embodiments, a current density on a supply reference voltage line LVSS is about 920 $\mu A/\mu m$, which is better than 1400 $\mu A/\mu m$ of another approach, and is less than a value indicating an electron migration violation.

Memory Cell

Figure 1A:
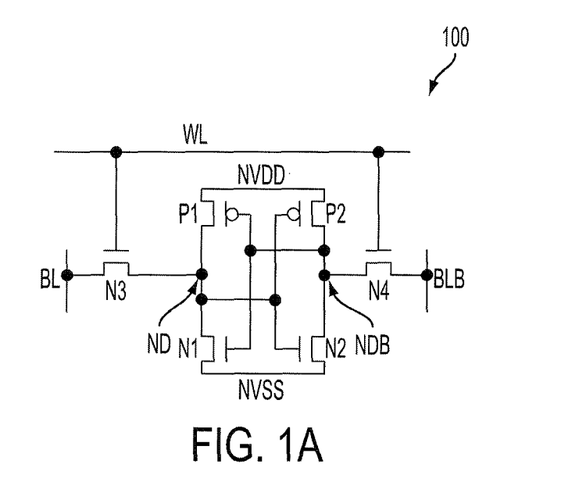
FIG. 1A is a diagram of a memory cell, in accordance with some embodiments.

FIG. 1A is a diagram of a memory cell or memory circuit 100, in accordance with some embodiments. Memory cell 100 is a static random access memory (SRAM) cell, and is used for illustration. Other types of memory are within the scope of various embodiments.

Memory cell 100 includes two P-type metal oxide semiconductor (PMOS) transistors P1 and P2, and four N-type metal oxide semiconductor (NMOS) transistors N1, N2, N3, and N4. Transistors P1, P2, N1, and N2 form a cross latch or a pair of cross-coupled inverters. For example, PMOS transistor P1 and NMOS transistor N1 form a first inverter while PMOS transistor P2 and NMOS transistor N2 form a second inverter.

Sources of transistors P1 and P2 are coupled together and serve as a node NVDD having a supply voltage VDD (not labeled). A drain of transistor P1 is coupled with a drain of transistor N1, a gate of transistor P2, a gate of transistor N2, and a source of transistor N3, and serves as a storage node ND. A drain of transistors P2 is coupled with a drain of transistor N2, a gate of transistor P1, a gate of transistor N1, and a source of transistor N4, and serves a storage node NDB. Sources of transistors N1 and N2 are coupled together and serve as a supply reference voltage node NVSS having a supply reference voltage VSS (not labeled).

A word line WL is coupled with a gate of each of transistors N3 and N4. In a row having a plurality of memory cells 100, word line WL is coupled with the gate of each of transistors N3 and N4 of the plurality of memory cells 100 in the row. Word line WL is also called a write control line because a signal on word line WL is used to control transistors N3 and N4 for the data to be transferred between bit lines BL, BLB and corresponding nodes ND, NDB.

A drain of transistor N3 is coupled to a bit line BL. A drain of transistor N4 is coupled to a bit line BLB. In a column having a plurality of memory cells 100, bit lines BL and BLB are coupled with each drain of corresponding transistors N3 and N4 of the plurality of memory cells 100 in the column.

Bit lines BL and BLB serve as both data input and output for memory cell 100. In some embodiments, in a write operation, applying a logical value to a first bit line and the opposite logical value to the other bit line enables writing the logical values on the bit lines to memory cell 100. Each of bit lines BL and BLB is also called a data line because the data carried on bit lines BL and BLB are written to and read from corresponding nodes ND and NDB.

In a write operation of memory cell 100, applying a logical value to a first bit line, such as bit line BL, and the opposite logical value to the other bit line, such as bit line BLB, enables writing the logical values at bit lines BL and BLB to nodes ND and NDB, respectively. Word line WL is then activated to turn on transistors N3 and N4, which electrically couples node ND to bit line BL and node NDB to bit line BLB. Effectively, activating word line WL transfers the data on bit lines BL and BLB to nodes ND and NDB, respectively.

In a read operation, bit lines BL and BLB are pre-charged to a high logical value. Word line WL is then activated to turn on transistors N3 and N4. As a result, node ND is electrically coupled with bit line BL and node NDB is electrically coupled with bit line BLB. Based on a low logical value of the data stored in a corresponding node ND or NBD, one bit line is pulled towards a low logical value and the other bit line remains at the same pre-charged high logical value. Effectively, a bit line split between bit lines BL and BLB develops. When the bit line split is sufficiently large, a sense amplifier is turned on to sense the developed bit line split between bit lines BL and BLB and reveals the data stored in nodes ND and NDB.

To illustrate a read operation, node ND stores a low logical value, and node NDB stores a high logical value. As a result, PMOS transistor P2 is on, NMOS transistor N2 is off, PMOS transistor P1 is off, and NMOS transistor N1 is on. Because bit line BLB is logically high, node NDB via the turned-on PMOS transistor P2 remains at the high logical value. When word line WL is activated for a read operation, transistor N3 is turned on. Because both transistors N1 and N3 are turned on, bit line BL is pulled towards reference voltage VSS or ground at the source of NMOS transistor N1. As bit line BLB stays at the same high logical value and bit line BL is pulled towards a low logical value, a bit line split between bit lines BL and BLB develops. When the bit line split is sufficiently large, a sense amplifier is turned on to sense the bit line split. The sense amplifier recognizes bit line BL being pulled towards a low logical value. As a result, the sense amplifier recognizes that node ND stores a low logical value and node NDB stores a high logical value.

When node ND stores a high logical value, node NDB stores a low logical value. Sensing node ND storing a high logical value is similar to sensing node NDB storing a low logical value. Operations to sense node NDB having a low logical value with references to NMOS transistors N2, N4 and bit line BLB are similar to operations to sense node ND having a low logical value with references to NMOS transistors N1, N3 and bit line BL as explained above.

Waveforms Related to Memory Cell

Figure 1B:
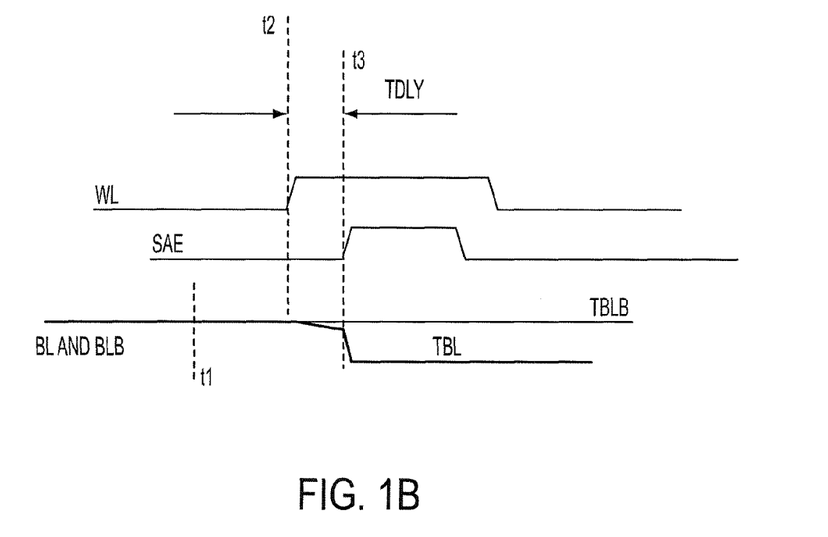
FIG. 1B is a graph of waveforms of various signals of the memory cell in FIG. 1, in accordance with some embodiments.

FIG. 1B is a graph of waveforms of various signals of memory cell 100 in FIG. 1, in accordance with some embodiments. For illustration, node ND of memory cell 100 stores a low logical value.

At a time t1, bit line BL and BLB are pre-charged to a high logical value.

At a time t2, word line WL in FIG. 1 is activated. As a result, bit line BL is electrically coupled with node ND and bit line BLB is electrically coupled with node NDB. By operations of memory cell 100, a bit line split between bit line BL and bit line BLB develops.

At a time t3, when the bit line split sufficiently develops, a sense amplifier enable signal SAE is activated with a high logical value to turn on a sense amplifier to sense the developed bit line split. In some embodiments, whether the bit line split is considered sufficient is based on a tracking time delay TTDLY shown in FIG. 2B.

A time delay TDLY includes a time from time t2 to time t3. Effectively, time delay TDLY includes a time from word line WL being activated to a time a sense amplifier being activated. Time delay TDLY is used to determine tracking time delay TTDLY shown in FIG. 2B.

Pull-Down Cell

Figure 2A:
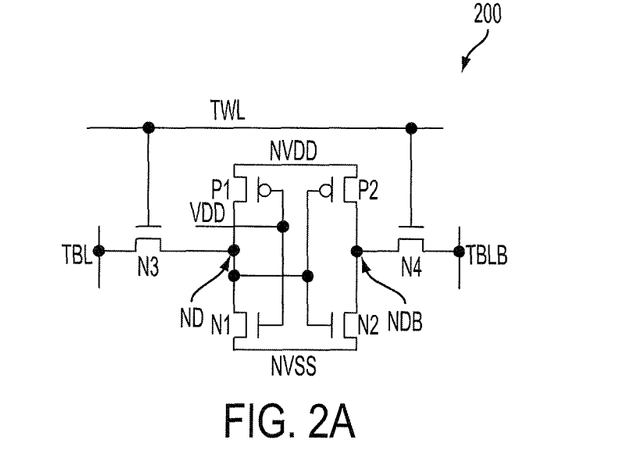
FIG. 2A is a diagram of a pull-down cell, in accordance with some embodiments.

FIG. 2A is a diagram of a circuit 200, in accordance with some embodiments. Circuit 200 is used as a pull-down cell in tracking circuit 400 in FIG. 4. In this document, the terms circuit 200 or pull-down cell 200 are used interchangeably.

Compared with circuit 100 in FIG. 1A, in circuit 200, a tracking word line TWL corresponds to word line WL. Tracking bit lines TBL and TBLB correspond to bit lines BL and BLB, respectively. Gates of transistors P1 and N1 receive a high logical value, such as a supply voltage VDD. As a result, when circuit 200 is in operation, NMOS transistor N1 is on. When tracking bit line TWL is activated with a high logical value, transistor N3 is turned on. For illustration, tracking bit line TBL is pre-charged to a high logical value. Because both transistors N3 and N1 are on, and tracking bit line TBL is logically high, a current IPD (not labeled) flows from tracking bit line TBL, transistor N3, and transistor N1 to node NVSS.

Waveforms Related to Pull-Down Cell

Figure 2B:
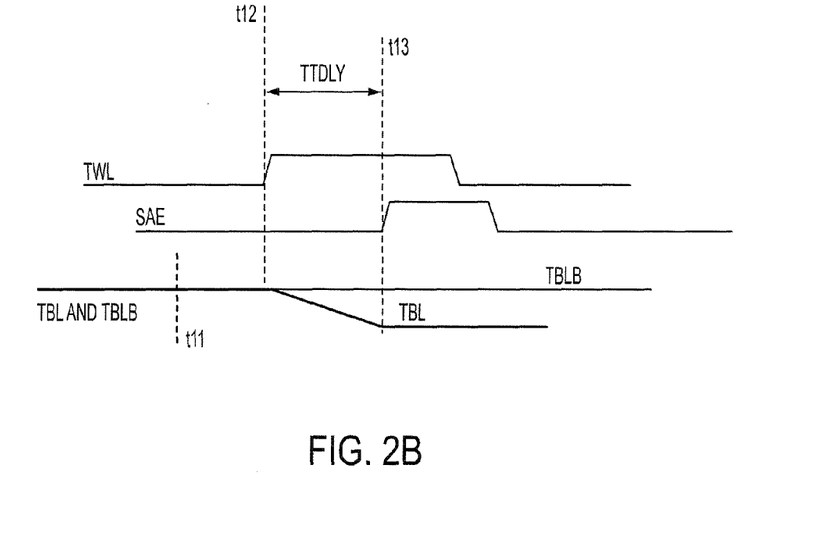
FIG. 2B is a graph of waveforms of various signals related to the memory cell in FIG. 1A and to the pull-down cell in FIG. 2A, in accordance with some embodiments.

FIG. 2B is a graph of waveforms of various signals related to pull-down cell 200, in accordance with some embodiments. For illustration, node ND of pull-down cell 200 in FIG. 2A stores a low logical value.

At a time t11, tracking bit line TBL and TBLB are pre-charged to a high logical value.

At a time t12, tracking word line TWL in FIG. 2A is activated. In some embodiments, word line WL in FIG. 1B and tracking word line TWL in FIG. 2B are activated at the same time. In other words, time t2 in FIG. 1B and time t12 occur at the same time. Because tracking word line TWL is activated, tracking bit line TBL is electrically coupled with node ND and tracking bit line TBLB is electrically coupled with node NDB. By operations of pull-down cell 200, tracking bit line TBL is pulled towards ground or reference voltage VSS at the source of transistor N1 of pull-down cell 200.

At a time t13, when tracking bit line TBL reaches a voltage level that is considered a low logical value, such as ground, signal SAE in FIG. 1B is activated with a high logical value to turn on the sense amplifier to sense the developed bit line split of bit lines BL and BLB in FIG. 1B.

Tracking time delay TTDLY includes a time from time t12 to time t13. Effectively, tracking time delay TTDLY includes a time from tracking word line TWL and word line WL being activated to a time to turn on a sense amplifier for the sense amplifier to sense the bit line split of bit lines BL and BLB in FIG. 1B.

Figure 3:
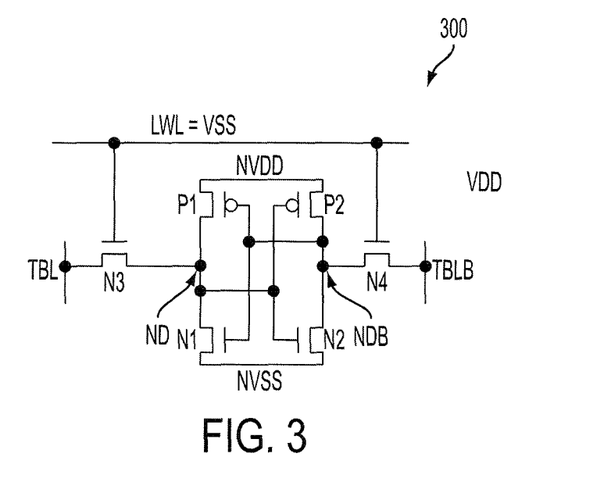
FIG. 3 is a diagram of a load cell, in accordance with some embodiments.

In some embodiments, pull down-cells 200 and load cells 300 in FIG. 3 in tracking circuit 400 are used to cause tracking time delay TTDLY to equal to or larger than a minimum threshold or a predetermined value THRES_TTDLY (not labeled). In some embodiments, threshold tracking time delay THRES_TTDLY is determined based on a statistical distribution of time delays TDLY of a plurality of memory cells 100 in FIG. 1 in a memory macro. For example, each memory cell 100 of the plurality of memory cells 100 has a time delay TDLY. As a result, the plurality of memory cells 100 has a plurality of time delays TDLY. In some embodiments, threshold tracking time delay THRES_TTDLY is a six-σ value of the plurality of time delays TDLY of the plurality of time delays TDLY. Further, the six-σ value of the plurality of time delays TDLY is considered to cover the worst case time delay of the plurality of memory cells 100. For example, after waiting for a time delay TTDLY of six-σ value from the time tracking word line TWL and word line WL being activated, the bit line split of bit lines BL and BLB is considered sufficiently developed to be sensed by the sense amplifier for all memory cells 100 in a memory macro. At about the time delay TTDLY having six-σ value of the plurality of time delays TDLY, signal SAE is activated to turn on the sense amplifier.

Load Cell

FIG. 3 is a diagram of a circuit 300, in accordance with some embodiments. Circuit 300 is used as a load cell in tracking circuit 400 in FIG. 4.

Compared with circuit 100, in circuit 300, a load word line LWL corresponds to word line WL. Load word line LWL therefore also corresponds to tracking word line TWL of circuit 200 in FIG. 2A. Further, load word line LWL is applied with a low logical value, such as supply reference voltage VSS. As a result, when circuit 300 is in operation, transistors N3 and N4 are turned off. Tracking bit lines TBL and TBLB correspond to bit lines BL and BLB, respectively.

Tracking Circuit

Figure 4:
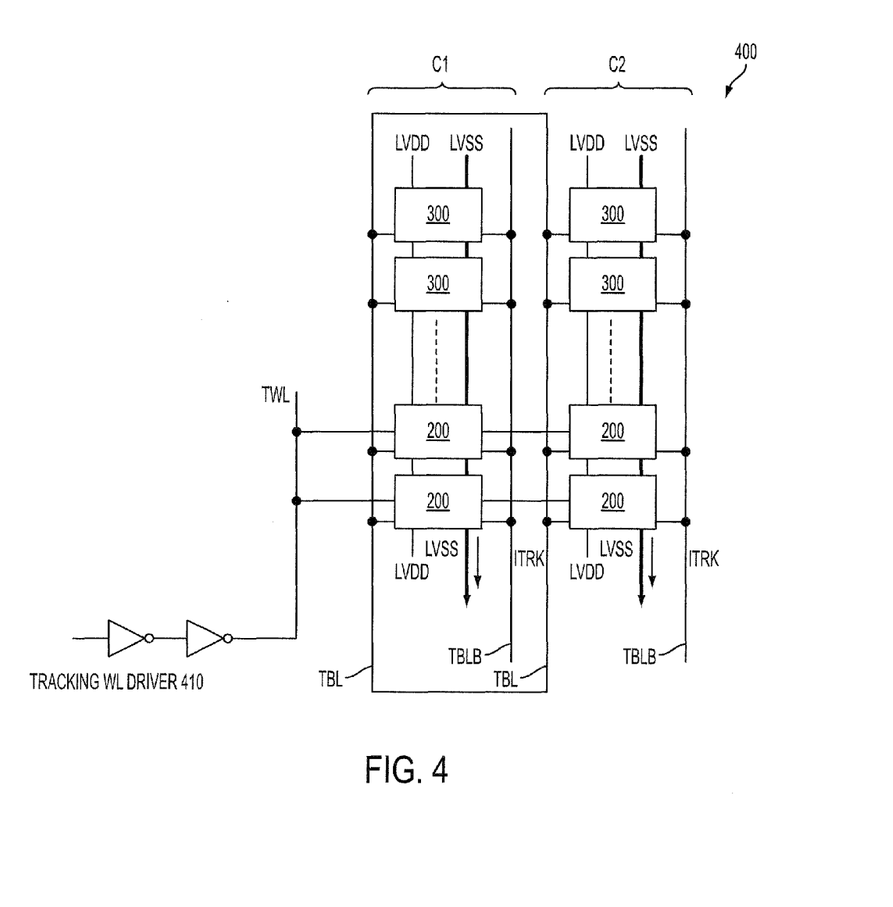
FIG. 4 is a diagram of a tracking circuit, in accordance with some embodiments.

FIG. 4 is a diagram of a tracking circuit 400, in accordance with some embodiments.

Tracking circuit 400 includes a plurality of tracking columns. For illustrations, tracking columns C1 and C2 are shown, and each of a tracking column is called a tracking column C.

Each tracking column C includes a plurality of pull-down cells 200, a plurality of load cells 300, a line LVDD of supply voltage VDD, a line LVSS of reference supply voltage VSS.

In various embodiments, a memory compiler is used to provide a memory macro based on a configuration specified by a user. The configuration includes, for example, the number of rows and the number of columns of the memory macro. For a particular configuration of the memory macro, a corresponding tracking circuit 400 is generated. In some embodiments, if the memory macro includes R number of rows, tracking circuit 400 also include R number of rows. In other words, the total number of pull-down cells 200 and load cells 300 in a column C equals to R.

Load cells 300 are used as a capacitive load for tracking column C. For example, because tracking bit line TBL is coupled with load cells 300, tracking bit line TBL is affected by a capacitance of each of load cells 300. Pull-down cells 200, together with load cells 300, are used to generate tracking time delay TTDLY.

In a tracking column C, line LVDD couples each node NVDD in FIG. 2A of pull-down cells 200 and each node NVDD in FIG. 3 of load cell 300. Similarly, line LVSS couples each node NVSS in FIG. 2 of pull-down cells 200 and each node NVSS in FIG. 3 of load cells 300. Additionally, a current ITRK flows from tracking bit line TBL through load cells 300, pull-down cells 200, and line LVSS to ground. For example, for each pull-down cell 200 in FIG. 2A, when tracking circuit 400 is in operation, current ITRK flows from tracking bit line TBL through transistors N3 and N1 in FIG. 2A to node NVSS, which is coupled with line LVSS. Further, for each load cell 300 in FIG. 3, a leakage current flows from node NVDD through transistors P1 and N1 and transistors P2 and N2 to node NVSS and line LVSS to ground. Additionally, a leakage current flows from tracking bit line TBL through transistors N3 and N1 to node NVSS and line LVSS to ground. Similarly, a leakage current flows from tracking bit line TBLB through transistors N4 and N2 to node NVSS and line LVSS to ground.

In some embodiments, a line LVSSC (not labeled) in a column of memory cells 100 of a memory macro is coupled with nodes NVSS of memory cells 100 in the column. Effectively, line LVSSC serves as a current path for memory cells 100 in the column. In some embodiments, line LVSS is similar to line LVSSC. In various embodiments, line LVSSC is designed to handle a certain amount of current based on the number of memory cells 100 in a corresponding number of rows to be read. For example, in some embodiments, one row of memory cells 100 is read in a read operation. Effectively, in a column of an array of a memory macro, one memory cell 100 is read. As a result, line LVSSC is designed for a maximum current that includes a current flowing through one memory cell 100 plus some margins. Because line LVSS is similar to line LVSSC, line LVSS is capable of carrying a maximum value of current ITRK.

Tracking bit line TBL is coupled with drains of transistors N3 in FIG. 2 of pull-down cells 200 in a plurality of columns C of tracking circuit 400. Tracking bit line TBL is also coupled with transistors N3 in FIG. 3 of load cells 300 in the plurality of columns of tracking circuit 400. For example, tracking bit line TBL of column C1 is coupled with drains of transistors N3 in column C1; tracking bit line TBL of column C2 is coupled with drains of transistors N3 in column C2; and tracking bit line TBL of column C1 is coupled with tracking bit line TBL of column C2. For simplicity, a reference to tracking bit line TBL of tracking circuit 400 also refers to tracking bit line TBL of each column C of tracking circuit 400.

In some embodiments, in a read operation, tracking bit line TBL is pre-charged to a high logical value, and is then pulled to a low logical value by pull-down cells 200. When tracking bit line TBL reaches the low logical value, the logical state of tracking bit line TBL is used to generate signal SAE in FIG. 2B to enable a corresponding amplifier, as illustrated in FIG. 2B.

In some embodiments, tracking bit line TBL is similar to bit line BL in a column of memory cells 100 in a memory array of a memory macro. Similar to a line LVSSC, in various embodiments, bit line BL in a column of memory cells 100 is designed to handle a certain amount of current based on the number of memory cells 100 in a corresponding number of rows to be read. For example, in some embodiments, one row of memory cells 100 is read in a read operation. Effectively, in a column of an array of a memory macro, one memory cell 100 is read. As a result, bit line BL is designed for a maximum current that includes a current flowing through one memory cell 100 plus some margins. Because tracking bit line TBL is similar to bit line BL, tracking bit line TBL is capable of carrying a maximum value of a current ITRK, that, in various situations, flows from tracking bit line TBL through pull-down cells 200 and line LVSS.

Tracking bit line TBLB in column C1 is coupled with drains of transistors N4 in column C1, and tracking bit line TBLB in column C2 is coupled with drains of transistors N4 in column C2. In some embodiments, tracking bit line TBLB of column C1 is coupled with tracking bit line TBLB of column C2. In some embodiments, each tracking bit line TBLB of a column C is floating. Other voltage levels applied to tracking bit line TBLB are within the scope of various embodiments.

Tracking word line TWL is coupled with gates of transistors N3 and N4 of pull-down cells 200 in a plurality of rows of tracking circuit 400. For example, with respect to a row of pull-down cells 200, tracking word line TWL is coupled with gates of transistors N3 and N4 of pull-down cells 200 in the row. Tracking word lines TWL in each row are then coupled together.

A tracking word line (WL) driver 410 controls tracking word line TWL including activating and deactivating tracking word line TWL. In some embodiments, when tracking word line TWL is activated with a high logical value, transistors N3 and N4 in FIG. 2 of corresponding pull-down cells 200 are turned on. Because transistors N3 and N1 are turned on, pull-down cells 200 pull a voltage level on tracking bit line TBL towards a low logical level at sources of transistors N1 or node NVSS. In various embodiments, a length of tracking word line TWL is designed to track a corresponding word line WL in FIG. 1 that couples a plurality of memory cells 100 in a row.

Distributions of Pull-Down Cells and Load Cells in Tracking Circuit

In some embodiments, a total number of pull down cells 200 and load cells 300 in tracking circuit 400 is distributed among a plurality of number of columns C1 based on various factors. For example, the total number of pull-down cells 200 and of load cells 300 in tracking circuit 400 are determined so that time delay TDLDY covers a worst case time delay TDLY of memory cells 100 in memory macro 100. In some embodiments, a total number of pull-down cells 200 and of load cells 300 in the plurality of columns C of tracking circuit 400 are determined so that tracking time delay TDLDY is equal to or greater than predetermined tracking time delay THRES_TTDLY.

In some embodiments, the leakage current drawn by load cells 300 is insignificant compared with the current drawn by pull-down cells 200. In other words, a value of current ITRK and the time delay effect on tracking time delay TTDLY is mostly contributed by pull-down cells 200. For illustration, the number of pull-down cells 200 and load cells 300 in a column C of tracking circuit 400 draw a particular value ITRKCELLS (not labeled). In some embodiments, the number of pull-down cells 200 and the number of load cells 300 in a column C are determined so that ITRKCELLS does not exceed a maximum or a predetermined value ITRKMAX (not labeled). For simplicity, a maximum number of pull-down cells 200 allowed in a column C is first determined such that ITRKCELLS is less than ITRKMAX. The number of load cells 300 in a column C is then calculated based on the number of rows of the memory array of the memory macro and the maximum number of pull-down cells 200 allowed in a column C.

In some embodiments, value ITRKMAX is determined based on the capacity of tracking bit line TBL and/or of line LVSS in a column C to handle a maximum current value. Further, a value of ITRKMAX is determined based on simulation. In some embodiments, a value of ITRKMAX is determined based on a specified electron migration (EM) violation. For example, to avoid an EM effect, current ITRKCELLS is specified to be less than ITRKMAX.

Exemplary Methods

Figure 5:
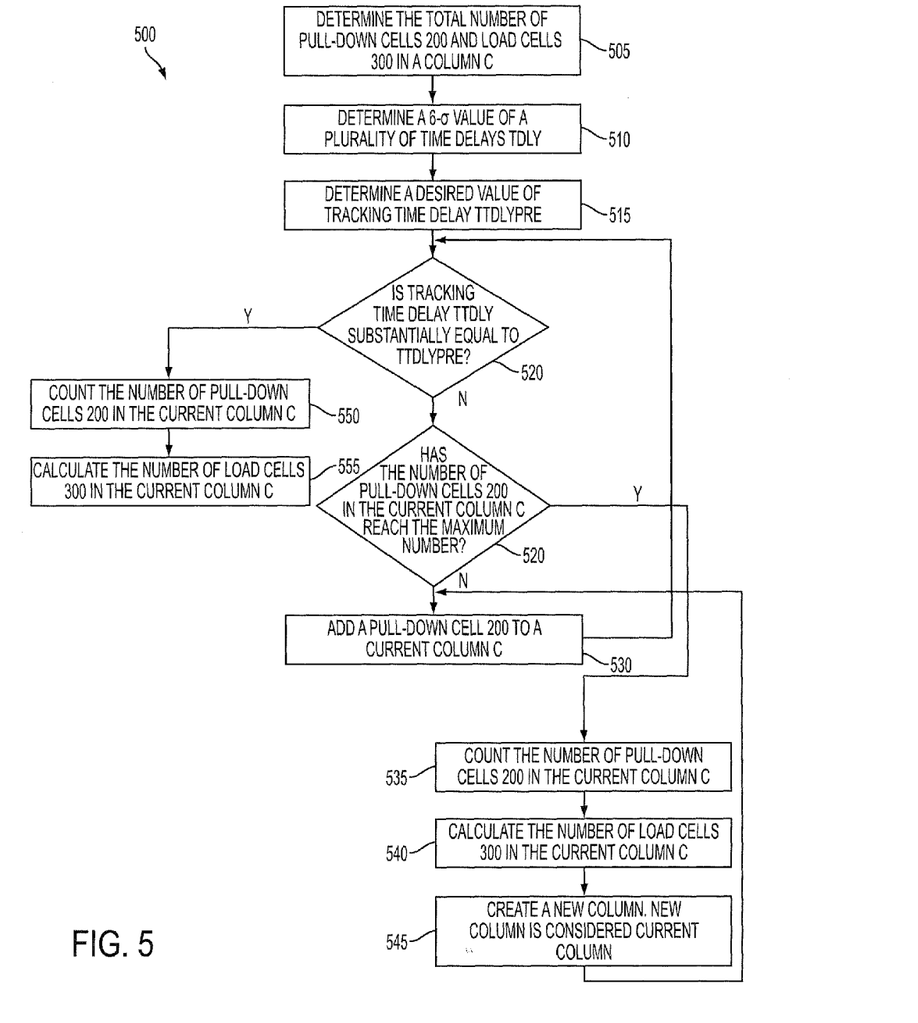
FIG. 5 is a flowchart of a method of generating the tracking circuit in FIG. 4, in accordance with some embodiments.

FIG. 5 is a flowchart of a method 500 of generating tracking circuit 400, in accordance with some embodiments. In this illustration, the number of pull-down cells 200 and load cells 300 in each column C of tracking circuit 400 are determined.

In operation 505, a total number of pull-down cells 200 and number of load cells 300 in a column C in tracking circuit 400 are determined. In some embodiments, the total number of pull-down cells 200 and the number of load cells 300 in a column C are equal to the number of rows of a memory array of a memory macro.

In operation 510, a 6-σ value of a plurality of time delays TDLY of a plurality of memory cells 100 of the memory macro is calculated.

In operation 515, a predetermined value THRES_TTDLY of tracking time delay TTDLY is determined based on the 6-σ value of a plurality of time delays TDLY. In some embodiments, THRES_TTDLY includes the 6-σ value of the plurality of time delays TDLY plus a predetermined margin.

For illustration, after operation 515, there is not any pull-down cell 200 in any column C of tracking circuit 400. As a result, method 500 proceeds through operations 520 and 525 to operation 530, as indicated by "N" of both operations 520 and 525.

In operation 530, a pull-down cell 200 is added to a column C, which, for illustration, is the first column C1. Because a pull-down cell 200 is added to column C1, pull down cell 200 causes a tracking time delay TTDLY. Method 500 then proceeds back to operation 520.

In operation 520, it is determined whether tracking time delay TTDLY is substantially equal to predetermined tracking time delay THRES_TTDLY. For illustration, tracking time delay TTDLY is greater than predetermined tracking time delay THRES_TTDLY. Method 500 proceeds to operation 525.

In operation 525, it is determined whether the number of pull-down cells 200 has reached the maximum number of pull-down cells 200 allowed in a column C, which, at this moment, is column C1. For illustration, the number of pull-down cells 200 has not reached the maximum number of pull-down cells 200 allowed in column C1. Method 500 proceeds to operation 530.

In operation 530, another pull-down cell 200 is added to the current column C1. Method 500 then loops in operations 520, 525, and 530 so that additional pull-down cells 200 are added to column C1 until, in operation 525, it is determined that the number of pull-down cells 200 has reached the maximum number of pull-down cells 200 allowed in column C1. Method 500 proceeds to operation 535 as indicated by "Y" of operation 525.

In operation 535, the number of pull-down cells 200 in current column C1 is counted.

In operation 540, the number of load-cells 300 in current column C1 is calculated based on the number of pull-down cells 200 counted in operation 535 and the number of rows of a memory array of a memory macro determined in operation 505.

In operation 545, a new column is created, which, for illustration, is column C2. Method 500 then proceeds to operation 530 in which a pull-down cell 200 is added to current column C2. Method 500 also loops through operations 520, 525, and 530 so that additional pull-down cells are added to column C2 until it is determined in operation 525 that the number of pull-down cells 200 has reached the maximum number of pull-down cells 200 allowed in current column C2. Method 500 then proceeds to operations 535, 540, and 545 in which the number of pull-down cells 200 and load cells 300 in column C2 are counted, and another column, such as column C3, is created. Method 500 then proceeds to operation 530 so that a pull-down cell 200 is added to column C3. Method 500 also loops through operations 520, 525, and 530 so that additional pull-down cells 200 are added to column C3 until the number of pull-down cells 200 has reached the maximum number of pull-down cells 200 allowed in column C3. For illustration, method 500 also proceeds to operation 545 so that another column such, as column C4, is created and additional pull-down cells 200 are added to column C4, etc.

During the above illustration, each time a pull-down cell 200 is added to a column of tracking circuit 400, tracking delay time TTDLY is getting closer to be equal to predetermined tracking time delay THRES_TTDLY. Up to a point when it is determined in operation 520 that tracking time delay TTDLY is substantially equal to THRES_TTDLY, method 500 then proceeds to operation 550 as indicated by "Y" of operation 520. For illustration, tracking time delay TTDLY is substantially equal to THRES_TTDLY when a pull-down cell 200 is added to column C5 of tracking circuit 400. In operation 550, the number of pull-down cells 200 in current column C5 is counted, and, in operation 555, the number of load cells 300 in current column C5 is calculated. At this moment, tracking circuit 400 has five columns C1-C5, and the number of pull-down cells 200 and number of load cells 300 in each column C1, C2, C3, C4, and C5 are known.

In the above illustration, five columns is used for illustration, another number of columns for tracking circuit 400 is within the scope of various embodiments. A pull-down cell 200 is added to a column C in operation 530 is for illustration, more than one pull-down cell 200 being added to a column are within the scope of various embodiments.

Figure 6:
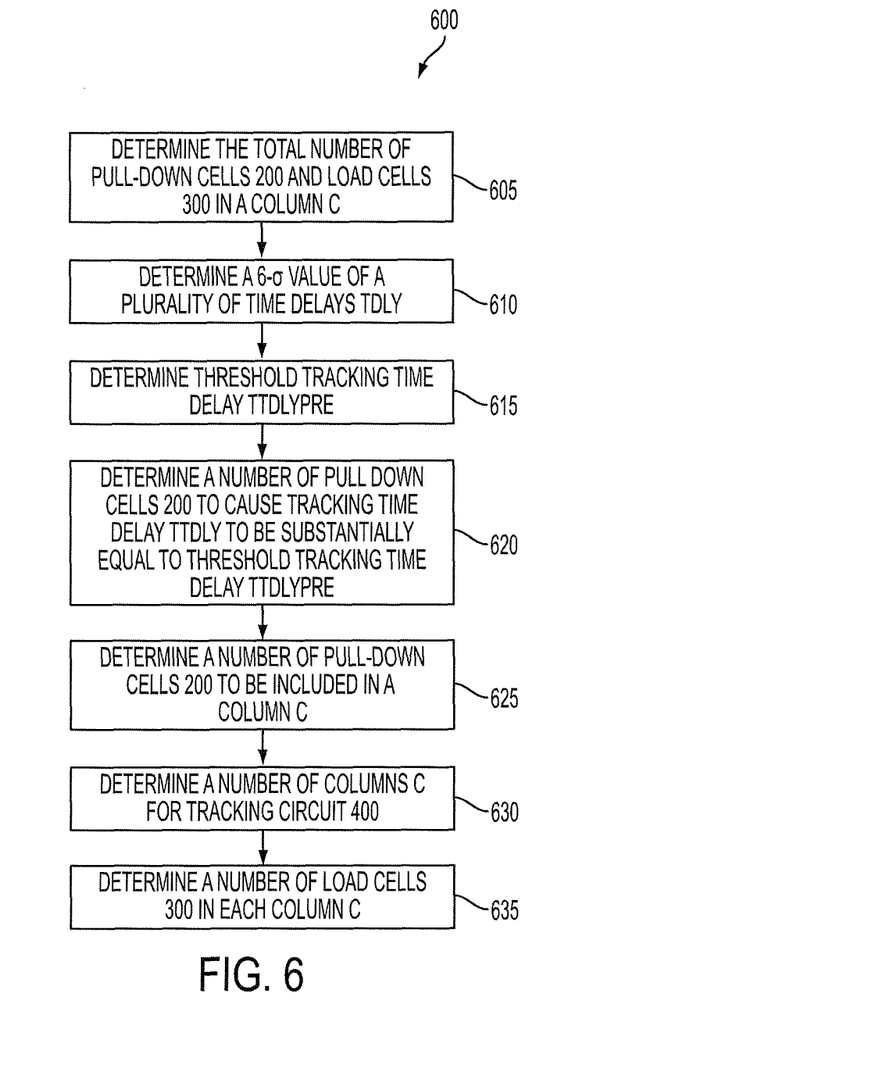
FIG. 6 is a flowchart of another method of generating the tracking circuit in FIG. 4, in accordance with some embodiments.

FIG. 6 is a flowchart of a method 600 of generating tracking circuit 600, in accordance with some embodiments.

Operations 605, 610, and 615 are similar to operations 505, 510, and 515 in FIG. 5, respectively. As a result, after operation 615, threshold tracking time delay THRES_TTDLY is determined.

In operation 620, a number of pull-down cells 200 in tracking circuit 400 to cause tracking time delay TTDLY to be substantially equal to threshold tracking time delay THRES_TTDLY is determined. For example, based on simulation, a current drawn by a pull-down cell 200 is determined to correspond to a time delay. As a result, based on threshold tracking time delay THRES_TTDLY, a number of pull-down cells 200 in tracking circuit 400 to cause tracking time delay TTDLY is determined.

In operation 625, a number of pull-down cells 200 to be included in a column C is determined. For example, the number of pull-down cells 200 to be included in a column C is less than or equal to the maximum number of pull-down cells 200 allowed in a column C. For example, based on current ITRKMAX and an amount of current drawn by each pull-down cell 200, a maximum number of pull-down cells 200 allowed in a column C is determined.

In operation 630, a number of columns C for tracking circuit 400 is determined based on the total number of pull-down cells 200 in tracking circuit 400 and in each column C.

In operation 635, a number of load cells 300 in each column C is determined based on the number of row of a corresponding memory array of a memory macro and the corresponding number of pull-down cells 200 in a column C.

FIGS. 5 and 6 include two methods of determining a number of columns C in tracking circuit 400 and different number of pull-down cells 200 and load cells 300 in a column C. Different ways to determine a number of columns C in tracking circuit 400 and different number of pull-down cells 200 and load cells 300 in a column C are within the scope of various embodiments.

In some embodiments, a current flowing through a voltage line and/or a data line in a column of a tracking circuit is determined. A threshold tracking time delay of the tracking circuit is determined. Based on the determined current handled by the voltage line and/or the data line and the determined threshold tracking time delay, a plurality of columns in the tracking circuit, a number of first cells in each column of the plurality of columns, and a number of second cells in the each column of the plurality of columns are determined.

In some embodiments, a threshold tracking time delay of a tracking circuit having a plurality of columns is determined. A current flowing through a first tracking cell of the tracking circuit is determined. The current corresponds to a tracking time delay of the first tracking cell. Based on the threshold tracking time delay of the tracking circuit and the tracking time delay of the first tracking cell, a number of first tracking cells for use in the tracking circuit is determined. The determined number of first tracking cells is distributed in a plurality of columns. A current drawn by a number of first tracking cells in a column of the plurality of columns is subject to a current value predetermined on a tracking data line and/or a tracking voltage line. The current drawn by the number of first tracking cells in the column flows through the tracking data line and the tracking voltage line.

In some embodiments, a threshold tracking time delay of a tracking circuit having a plurality of columns is determined. A current flowing through a first tracking cell of the tracking circuit is determined. The current corresponds to a tracking time delay of the first tracking cell. Based on the determined threshold tracking time delay and the determined current flowing through the first tracking cell, performing the following operations 1) providing a plurality of first tracking cells to a first column of the tracking circuit, wherein a number of the plurality of first tracking cells is based on a current drawn by the plurality of first tracking cells and a current handling capacity of a data line and/or a voltage line of the first column and 2) providing at least one other first tracking cell to a second column of the tracking circuit.

In some embodiments, a threshold tracking time delay of a tracking circuit is determined. Based on a number of first tracking cells in the tracking circuit, a tracking time delay substantially equal to the threshold tracking time delay is caused. The tracking circuit includes a plurality of columns. A first column of the plurality of columns includes at least one first tracking cell and at least one second tracking cell. A second column of the plurality of columns includes at least another first tracking cell and at least another second tracking cell. A number of the at least one first tracking cell of the first column is based on a current drawn by the at least one first tracking cell in the first column and a current-handling capability of a tracking data line (TBL) and/or a voltage line associated with the first column. The number of the at least one first tracking cell of the first column and a number of the at least one second tracking cell of the first column equal a number of rows of a memory array of a memory macro.

Computer

Figure 7:
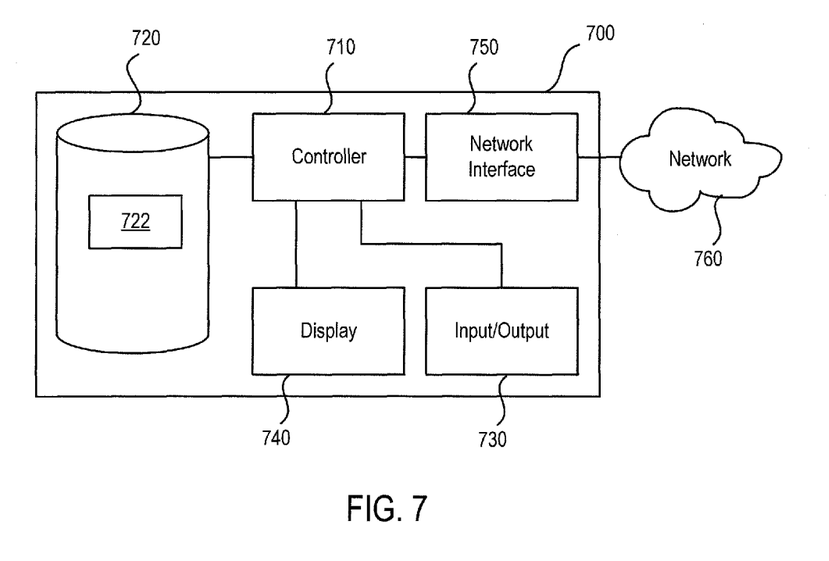
FIG. 7 is a diagram of a computer, in accordance with some embodiments.

FIG. 7 is a functional block diagram of a computer system 700, in accordance with some embodiment. In some embodiments, computer 700 is used to implement various methods of the present disclosure, including, for example, methods 500 and 600 in FIGS. 5 and 6, respectively.

A controller 710 controls logic, processes information, and coordinates activities of computer system 700. For example, controller 710 is configured to execute computer program code 722 to cause computer 700 to implement methods 500 and 600. In some embodiments, controller 710 is a central processing unit (CPU), a multi-processor, a distributed processing system, an application specific integrated circuit (ASIC), and/or a suitable processing unit.

Computer readable storage medium 720 includes program code or a set of executable instructions 722. Storage medium 720 also stores information including, for example, information used to perform methods 500 and 600, information generated during performing methods 500 and 600, etc. In some embodiments, storage medium 720 is a non-transitory storage medium.

In some embodiments, storage medium 720 is an electronic, magnetic, optical, electromagnetic, infrared, and/or a semiconductor system, apparatus, or device. For example, storage medium 720 includes a semiconductor or solid-state memory, a magnetic tape, a removable computer diskette, a random access memory (RAM), a read-only memory (ROM), a rigid magnetic disk, and/or an optical disk. In some embodiments, storage medium 720 includes a compact disk-read only memory (CD-ROM), a compact disk-read/write (CD-R/W), and/or a digital video disc (DVD).

An input-output interface 730 enables a programmer to provide data to computer system 700, to manipulate computer system 700 to perform methods 500 and 600, for example.

A display 740 displays information to users of computer 700, including, for example, a status of operations of methods 500 and 600. In some embodiments, display 740 includes a graphical user Interface (GUI). In some embodiments, input-output interface 730 and display 740 enable a user to operate computer system 700 in an interactive manner.

A network interface 750 enables computer system 700 to communicate with a network 760, to which one or more other computer systems are connected. Network interface 750 includes wireless network interfaces such as BLUETOOTH, WIFI, WIMAX, GPRS, or WCDMA. Alternatively and/or additionally network interface 750 includes a wired network interface such as an ETHERNET, USB, or IEEE-1394 port.

A number of embodiments have been described. It will nevertheless be understood that various modifications may be made without departing from the spirit and scope of the disclosure. For example, the above embodiments are explained in the context of line VLSS. Various inventive concepts are applicable to tracking bit line TBL and to supply voltage line LVDD in view of the disclosure in this document. Various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A method comprising:
   determining a current flowing through a voltage line and/or a data line in a column of a tracking circuit;
   determining a threshold tracking time delay of the tracking circuit; and
   based on the determined current flowing through the voltage line and/or the data line and the threshold tracking time delay, determining a plurality of columns in the tracking circuit, a number of first cells in each column of the plurality of columns, and a number of second cells in the each column of the plurality of columns.

2. The method of claim 1, wherein
   determining the threshold tracking time delay is based on a statistical distribution of a plurality of time delays of a plurality of memory cells.

3. The method of claim 1, wherein
   determining the threshold tracking time delay is based on a worst case time delay of a plurality of time delays of a plurality of memory cells.

4. The method of claim 1, wherein
   a first cell of the number of first cells includes a first transistor coupled in series with a second transistor;
   the first transistor and the second transistor cause a delay time on a tracking data line associated with the first cell of the number of first cells;
   a memory cell to be tracked by the tracking circuit includes a third transistor and a fourth transistor; and
   the third transistor and the fourth transistor cause a time delay on a memory data line associated with the memory cell to be tracked.

5. The method of claim 1, wherein
   determining the number of columns in the tracking circuit, the number of first cells in each column of the plurality of columns, and each number of second cells in the each column of the plurality of columns comprises
      adding a first tracking cell to a first column until a first number of first tracking cells in the first column reaches a number specified for the first column;
      calculating the number of second cells in the first column;
      adding another tracking cell to a second column; and
      calculating the number of second cells in the second column.

6. A method comprising:
   determining a threshold tracking time delay of a tracking circuit having a plurality of columns;
   determining a current flowing through a first tracking cell of the tracking circuit, wherein the current corresponds to a tracking time delay of the first tracking cell; and
   based on the determined threshold tracking time delay and the determined current flowing through the first tracking cell, performing the following operations
      providing a plurality of first tracking cells to a first column of the tracking circuit, wherein a number of the plurality of first tracking cells is based on a current drawn by the plurality of first tracking cells and a current handling capacity of a data line and/or a voltage line of the first column; and
      providing at least one other first tracking cell to a second column of the tracking circuit.

7. The method of claim 6, wherein
   the current flowing through the first tracking cell flows through the data line, a first transistor of the first tracking cell, a second transistor of the tracking cell, and the voltage line.

8. The method of claim 6, further comprising
   providing at least one second tracking cells to the first column of the tracking circuit,
   wherein
      a number of the plurality of first tracking cells plus a number of the at least one second tracking cells equal a number of rows in a memory array of a memory macro.

9. The method of claim 6, further comprising
   providing at least one second tracking cells to the second column of the tracking circuit,
   wherein
      a number of the at least one first tracking cell plus a number of the at least one second tracking cells equal a number of rows in a memory array of a memory macro.

10. The method of claim 6, wherein
    a first cell of the number of first cells includes a first transistor coupled in series with a second transistor;

the first transistor and the second transistor cause a delay time on a tracking data line associated with the first cell of the number of first cells;
a memory cell to be tracked by the tracking circuit includes a third transistor and a fourth transistor; and
the third transistor and the fourth transistor cause a time delay on a memory data line associated with the memory cell to be tracked.

11. A method comprising:
determining a threshold tracking time delay of a tracking circuit having a plurality of columns;
determining a current flowing through a first tracking cell of the tracking circuit, wherein the current corresponds to a tracking time delay of the first tracking cell;
based on the threshold tracking time delay and the tracking time delay of the first tracking cell, determining a number of first tracking cells for use in the tracking circuit; and
distributing the determined number of first tracking cells in a plurality of columns, wherein a current drawn by a number of first tracking cells in a column of the plurality of columns is subject to a current value predetermined on a tracking data line and/or a tracking voltage line, and the current drawn by the number of first tracking cells in the column flowing through the tracking data line or the tracking voltage line.

12. The method of claim 11 wherein
determining the threshold tracking time delay is based on a statistical distribution of a plurality of time delays of a corresponding plurality of memory cells.

13. The method of claim 11, wherein
the first tracking cell includes a first transistor coupled in series with a second transistor;
the first transistor is coupled with the tracking data line;
the second transistor is coupled with the voltage line; and
the current flowing through the first tracking cell flows through the tracking data line, the first transistor, the second transistor, and the tracking voltage line.

14. The method of claim 11, wherein
the first tracking cell includes a first transistor coupled in series with a second transistor;
the first transistor and the second transistor cause a time delay on a tracking data line associated with the first cell of the number of first cells;
a second tracking cell includes a third transistor coupled in series with a fourth transistor; and
the third transistor is turned off when the tracking circuit is in operation.

15. The method of claim 11, wherein
the tracking circuit further comprises a plurality of second cells; and
the method further comprises distributing the plurality of second cells in the plurality of columns.

16. The method of claim 11, wherein
distributing the determined number of first tracking cells in a plurality of columns comprises adding a first tracking cell to a first column until a first number of first tracking cells in the first column reaches a number specified for the first column; and
adding another tracking cell to a second column.

17. The method of claim 11, wherein
a first cell of the number of first cells includes a first transistor coupled in series with a second transistor;
the first transistor and the second transistor cause a delay time on a tracking data line associated with the first cell of the number of first cells;
a memory cell to be tracked by the tracking circuit includes a third transistor and a fourth transistor; and
the third transistor and the fourth transistor cause a delay time on a memory data line associated with the memory cell to be tracked.

18. A method comprising:
determining a threshold tracking time delay of a tracking circuit; and
based on a number of first tracking cells in the tracking circuit, causing a tracking time delay substantially equal to the threshold tracking time delay,
wherein
the tracking circuit includes a plurality of columns;
a first column of the plurality of columns includes
at least one first tracking cell; and
at least one second tracking cell;
a second column of the plurality of columns includes
at least another first tracking cell; and
at least another second tracking cell;
a number of the at least one first tracking cell of the first column is based on a current drawn by the at least one first tracking cell in the first column and a current-handling capability of a tracking data line and/or a voltage line associated with the first column; and
the number of the at least one first tracking cell of the first column and a number of the at least one second tracking cell of the first column equal a number of rows of a memory array of a memory macro.

19. The method of claim 18, wherein
causing a tracking time delay substantially equal to the threshold tracking time delay comprises activating a tracking data line of the tracking circuit; and
the tracking data line is coupled with each gate of each transistor of the at least one first tracking cell and of the at least another tracking cell.

20. The method of claim 18, wherein
a first tracking cell includes a first transistor coupled in series with a second transistor;
the first transistor and the second transistor cause a time delay on a tracking data line associated with the first cell of the number of first cells;
a second tracking cell includes a third transistor coupled in series with a fourth transistor; and
the third transistor is turned off when the tracking circuit is in operation.

* * * * *